United States Patent
Hane et al.

(10) Patent No.: US 11,970,768 B2
(45) Date of Patent: Apr. 30, 2024

(54) FILM FORMING METHOD AND FILM FORMING APPARATUS

(71) Applicant: Tokyo Electron Limited, Tokyo (JP)

(72) Inventors: Hideomi Hane, Nirasaki (JP); Shimon Otsuki, Oshu (JP); Takeshi Oyama, Nirasaki (JP); Ren Mukouyama, Oshu (JP); Jun Ogawa, Nirasaki (JP); Noriaki Fukiage, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/993,432

(22) Filed: Aug. 14, 2020

(65) Prior Publication Data
US 2021/0054502 A1 Feb. 25, 2021

(30) Foreign Application Priority Data
Aug. 19, 2019 (JP) .................................. 2019-149951

(51) Int. Cl.
*C23C 16/34* (2006.01)
*C23C 16/455* (2006.01)
(Continued)

(52) U.S. Cl.
CPC ...... *C23C 16/345* (2013.01); *C23C 16/45536* (2013.01); *C23C 16/45544* (2013.01);
(Continued)

(58) Field of Classification Search
CPC . C23C 16/345; C23C 16/45536; C23C 16/52; C23C 16/0272; C23C 16/24;
(Continued)

(56) References Cited

U.S. PATENT DOCUMENTS 5,939,333 A * 8/1999 Hurley .............. H01L 21/02307
438/791
2004/0041956 A1* 3/2004 Hwang ............. G02F 1/136286
349/43
(Continued)

FOREIGN PATENT DOCUMENTS

JP 2013-084911 A 5/2013
JP 2016-131210 A 7/2016
(Continued)

*Primary Examiner* — Michael G Miller
(74) *Attorney, Agent, or Firm* — Nath, Goldberg & Meyer; Jerald L. Meyer; Tanya E. Harkins

(57) ABSTRACT

There is provided a method of forming a silicon nitride film on a substrate having first and second films formed thereon, wherein the first film and the second film have different incubation times. The method includes: supplying a processing gas composed of a silicon halide having Si—Si bonds to the substrate; supplying a non-plasmarized second nitriding gas to the substrate; forming a thin silicon nitride layer covering the first film and the second film by repeating the supplying the processing gas and the supplying the second nitriding gas in a sequential order; supplying a plasmarized modifying gas to the substrate and modifying the thin silicon nitride layer; and forming the silicon nitride film on the modified thin silicon nitride layer by supplying the raw material gas and the first nitriding gas to the substrate.

7 Claims, 11 Drawing Sheets

(51) Int. Cl.
  *C23C 16/52* (2006.01)
  *H01J 37/32* (2006.01)
  *H01L 21/02* (2006.01)
(52) U.S. Cl.
  CPC ........ *C23C 16/52* (2013.01); *H01J 37/32449* (2013.01); *H01L 21/0217* (2013.01); *H01L 21/0228* (2013.01)
(58) Field of Classification Search
  CPC ........ C23C 16/45551; C23C 16/45553; C23C 16/45525; C23C 16/45544; C23C 16/4581; C23C 16/50; C23C 16/45542; H01L 21/0217; H01L 21/02175; H01L 21/02211; H05H 1/24; H01J 37/32192; H01J 37/32229; H01J 37/3244; H01J 37/32449; H01J 37/32752; H01J 21/02274; H01J 21/0228
  See application file for complete search history.

(56) References Cited

U.S. PATENT DOCUMENTS

| | | | |
|---|---|---|---|
| 2005/0046771 A1* | 3/2005 | Lee | G02F 1/1362 349/126 |
| 2014/0023794 A1* | 1/2014 | Mahajani | G02F 1/136286 349/43 |
| 2017/0037513 A1* | 2/2017 | Haukka | C23C 16/45525 |

FOREIGN PATENT DOCUMENTS

| | | | |
|---|---|---|---|
| JP | 2017-175106 A | 9/2017 | |
| KR | 1020170108853 A | 9/2017 | |
| WO | WO-2005008763 A2 * | 1/2005 | ........... C23C 16/308 |

* cited by examiner

FILM FORMING METHOD AND FILM FORMING APPARATUS

CROSS-REFERENCE TO RELATED APPLICATION

This application is based upon and claims the benefit of priority from Japanese Patent Application No. 2019-149951, filed on Aug. 19, 2019, the entire contents of which are incorporated herein by reference.

TECHNICAL FIELD

The present disclosure relates to a film forming method and a film forming apparatus.

BACKGROUND

In a semiconductor manufacturing process, there is a case in which a film forming process of forming a silicon nitride (SiN) film on a semiconductor wafer (hereinafter referred to as a "wafer") as a substrate is performed. There may be a case in which films having different incubation times (to be described later) are exposed on the surface of the wafer. Even in that case, it is required to form the SiN film in each portion of the in-plane of the wafer with a high film thickness uniformity. Patent Document 1 discloses a technique in which ammonia ($NH_3$) is supplied to and adsorbed onto a wafer having a silicon (Si) film and a silicon oxide ($SiO_2$) film exposed on the surface thereof, and then the wafer is exposed to plasma of argon (Ar) gas so as to nitride each of the films. Then, after the nitridation, a raw material gas containing silicon and plasmarized $NH_3$ gas are alternately supplied to the wafer so as to form a silicon nitride (SiN) film.

PRIOR ART DOCUMENT

Patent Document

Patent Document 1: Japanese Laid-Open Patent Publication No. 2017-175106

SUMMARY

According to one embodiment of the present disclosure, there is provided a film forming method of forming a silicon nitride film on a substrate having a first film and a second film formed thereon, wherein the first film and the second film have different incubation times required until a growth of the silicon nitride film starts when a raw material gas containing silicon and a first nitriding gas for nitriding the silicon are supplied, the film forming method including: supplying a processing gas composed of a silicon halide having Si—Si bonds to the substrate; supplying a non-plasmarized second nitriding gas to the substrate; forming a thin silicon nitride layer covering the first film and the second film by repeating the supplying the processing gas and the supplying the second nitriding gas in a sequential order; supplying a plasmarized modifying gas to the substrate and modifying the thin silicon nitride layer; and forming the silicon nitride film on the modified thin silicon nitride layer by supplying the raw material gas and the first nitriding gas to the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
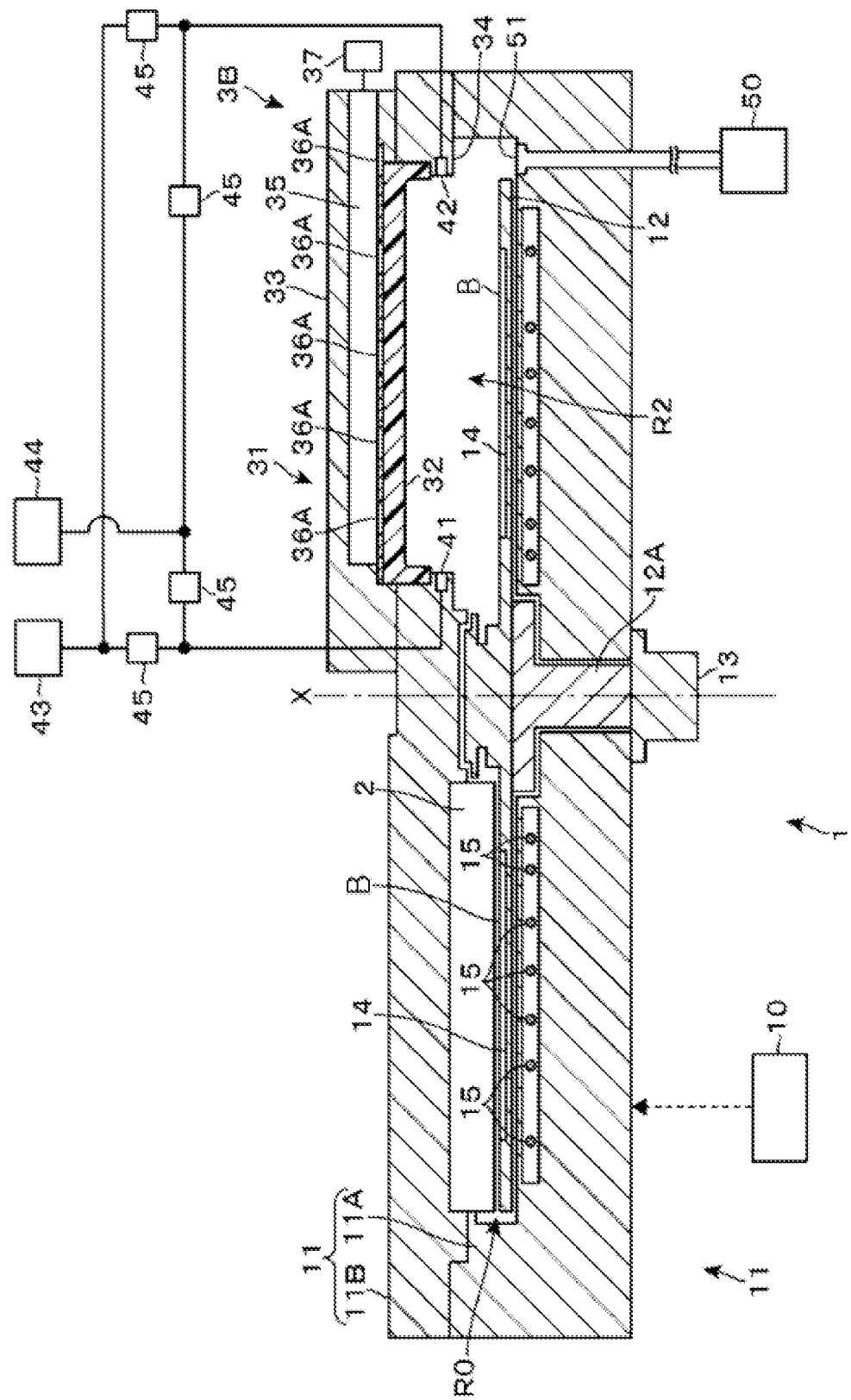
FIG. 1 is a vertical cross-sectional view of a film forming apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An outline of a film forming method according to an embodiment of the present disclosure will be described first. In this embodiment, a process is performed to form a SiN film on a wafer B having a silicon (Si) film, a silicon oxide ($SiO_2$) film, and a tungsten (W) film as a metal film, exposed on the surface thereof. Since W is an easy-to-oxidize material, the process is performed in a state in which oxygen atoms are present on the surface of the W film.

Here, the incubation time of the SiN film will be described. The incubation time of the SiN film is a time required, when forming a SiN film by supplying a raw material gas containing silicon and a nitriding gas for nitriding the silicon, until the start of the formation of the SiN film after starting the supply of one of the above-mentioned gases. More specifically, by supplying each of the raw material gas and the nitriding gas, a plurality of island-shaped SiN nuclei are formed on an underlying film of the SiN film. When the nuclei of SiN spread and grow along a surface of the underlying film and come into contact with each other so that a thin layer is formed, the thin layer grows as a SiN film (the film thickness increases). Accordingly, a timing at which the growth of the film starts corresponds to a timing at which the thin SiN layer is formed. The time required for the formation and growth of the nuclei varies depending on the type of the film that is in contact with the SiN film, which is the underlying film of the SiN film.

The expression "the incubation times of the SiN films between respective films differ from each another" means that, when forming SiN films in contact with respective films by supplying a raw material gas and a nitriding gas under the same conditions for respective films, the times from the start of the supply of the gases to the formation of the above-mentioned thin layer differ from each another. Additionally, as a result of performing a comparison without performing processes other than the adsorption of the raw material gas and the nitridation of the silicon in the raw material gas by the nitriding gas, the times until the thin layers are formed differ from each another. That is, as a result of comparison performed without performing processes such as reduction and modification by hydrogen plasma as in the present embodiment, it means that the times until the thin layers are formed differ from each another. In addition, the nitriding gas referred to herein also includes a plasmarized nitriding gas in addition to a non-plasmarized nitriding gas.

When the raw material gas and the nitriding gas are supplied to respective underlying films for which incubation times differ from each other as described above, due to the difference in the incubation times, a variation may occur in the thicknesses of SiN films formed in contact with respective underlying films. The incubation time of the SiN film differs from each another between a W film, a $SiO_2$ film, and a Si film formed on a wafer B of the present embodiment. Specifically, assuming that the W film and the $SiO_2$ film are first films and the Si film is as a second film, the incubation time of the first films is longer than that of the second film.

When performing the film formation on respective films for which the incubation times of the SiN film differ from each other as described above, as illustrated in an evaluation test described later, pre-processing may be performed in order to make surface states of the films uniform by exposing the wafer B to the plasma of $N_2$ gas. After performing the pre-processing for exposure to the plasma of $N_2$ gas, a SiN film is formed through, for example, ALD. However, the plasma of $N_2$ gas has a relatively high nitriding power. Therefore, when the wafer B is processed with the plasma of $N_2$ gas as described above, for example, the Si film may be nitrided from the surface thereof to the deep portion and is turned into SiN, which may degrade the yield of semiconductor products manufactured from the wafer B.

Therefore, in the present embodiment, the pre-processing, which is performed to suppress the influence of the difference in incubation time and make the film thickness of the SiN film uniform, is performed such that the nitridation of the Si film is suppressed. Specifically, first, a thin SiN layer is formed by alternately supplying a disilicon hexachloride ($Si_2Cl_6$) gas and a $NH_3$ gas (a second nitriding gas) to the wafer B without plasmarizing the gases. Then, a plasmarized $NH_3$ gas is supplied so as to modify the thin SiN layer.

Then, after performing the aforementioned pre-processing, a SiN film is formed on the thin SiN layer by performing an atomic layer deposition (ALD) using the $Si_2Cl_6$ gas and a plasmarized $NH_3$ gas (a first nitriding gas). Hereinafter, hexachlorodisilane ($Si_2Cl_6$) may be referred to as HCD. As described above, the HCD gas is a processing gas for performing the pre-processing, and is a raw material gas for forming a SiN film. In this specification, silicon nitride is referred to as SiN regardless of the stoichiometric ratio thereof. Accordingly, the description of SiN includes, for example, $Si_3N_4$. Furthermore, the above-mentioned underlying film may include the wafer B itself, in addition to the film formed on the wafer B. Accordingly, for example, the above-mentioned Si film may be a film formed on a silicon wafer or the silicon wafer itself.

Figure 2:
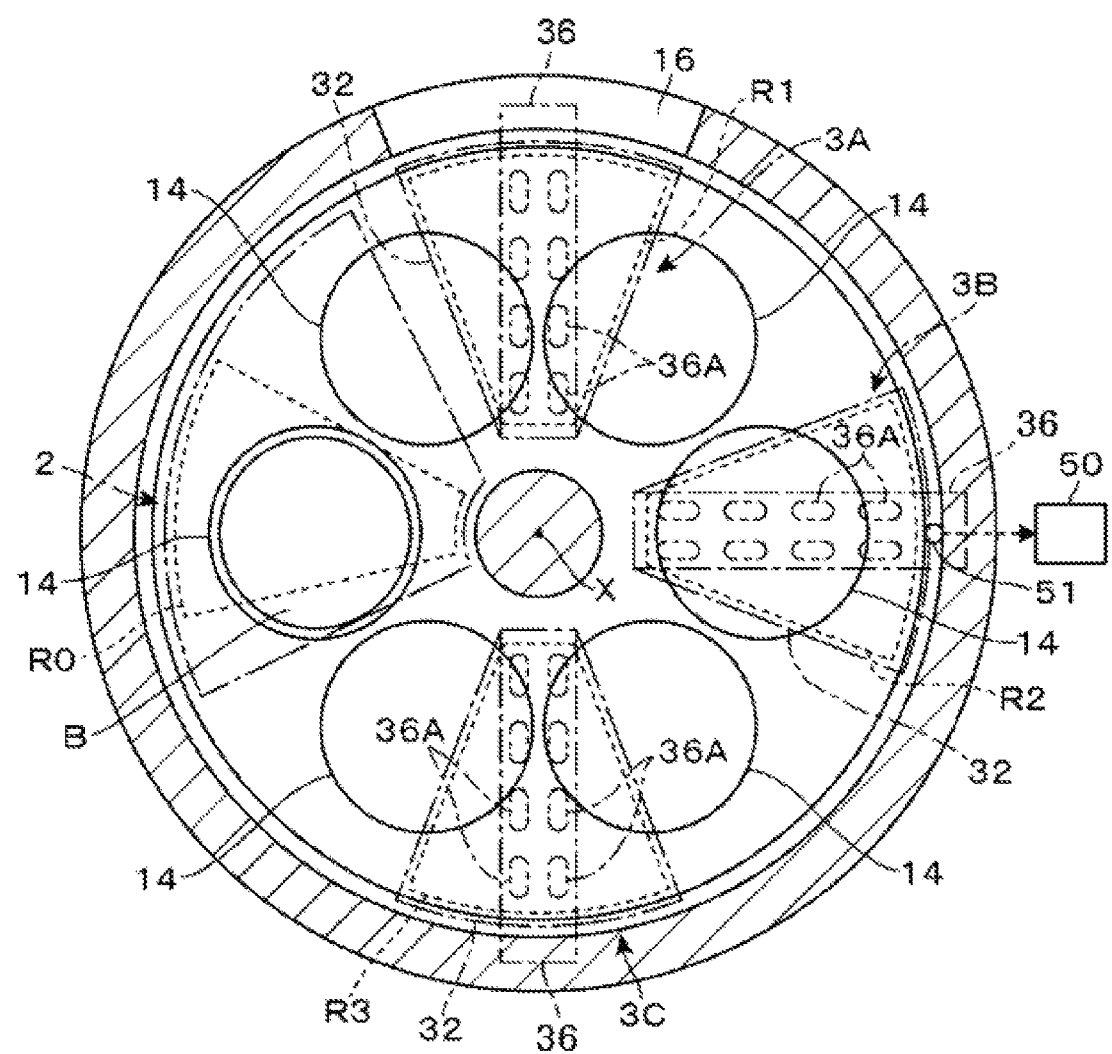
FIG. 2 is a horizontal cross-sectional view of the film formation apparatus.

Hereinafter, a film forming apparatus 1, which is an embodiment of an apparatus for carrying out the above-described film forming method, will be described with reference to a vertical cross-sectional view of FIG. 1 and a horizontal cross-sectional view of FIG. 2. The film forming apparatus 1 includes a flat vacuum container (processing container) 11 having a substantially circular shape. The vacuum container 11 includes a container body 11A constituting a sidewall and a bottom, and a ceiling plate 11B. In the drawing, reference numeral 12 denotes a circular rotary table horizontally provided within the vacuum container 11. In FIG. 1, reference numeral 12A is a supporting part that supports the central portion of a rear surface of the rotary table 12. In FIG. 1, reference numeral 13 denotes a rotary mechanism that rotates the rotary table 12 clockwise in a plan view along the circumferential direction of the rotary table 12 via the supporting part 12A. In addition, X in FIG. 1 denotes a rotational axis of the rotary table 12.

Six circular recesses 14 are provided in a top surface of the rotary table 12 along the circumferential direction (rotational direction) of the rotary table 12. Wafers B are accommodated in respective recesses 14. That is, each wafer B is placed on the rotary table 12 so as to revolve with the rotation of the rotary table 12. In addition, reference numeral 15 in FIG. 1 denotes a plurality of heaters concentrically provided in a bottom portion of the vacuum container 11 and configured to heat the wafers B placed on the rotary table 12. In FIG. 2, reference numeral 16 denotes a transfer port opened in a sidewall of the vacuum container 11 to transfer the wafer W therethrough. The transfer port 16 is configured to be capable of being opened and closed by a gate valve (not illustrated). The wafer B is delivered between the outside of the vacuum container 11 and the inside of each recess 14 through the transfer port 16 by a substrate transfer mechanism (not illustrated).

Above the rotary table 12, a shower head 2, a first plasma-forming unit 3A, a second plasma-forming unit 3B, and a third plasma-forming unit 3C are provided in that order along a rotational direction of the rotary table 12 towards a downstream side in the rotational direction. The shower head 2, which is a first gas supply part, supplies the wafer B with the HCD gas used for each of the film formation of the SiN and the pre-processing. The first to third plasma-forming units 3A to 3C, which are second gas supply parts, are units for plasmarizing a plasma-forming gas supplied onto the rotary table 12 to perform plasma processing on the wafer B. Each of the first to third plasma-forming units 3A to 3C may be configured to form plasma of $H_2$ gas alone and plasma of $NH_3$ gas and $H_2$ gas. Further, below the outside of the rotary table 12 in the vacuum container 11 and outside the second plasma-forming unit 3B, an exhaust port 51 for exhausting the plasma-forming gases supplied by the first to third plasma-forming units 3A to 3C therethrough is opened. The exhaust port 51 is connected to an exhaust mechanism 50.

Figure 3:
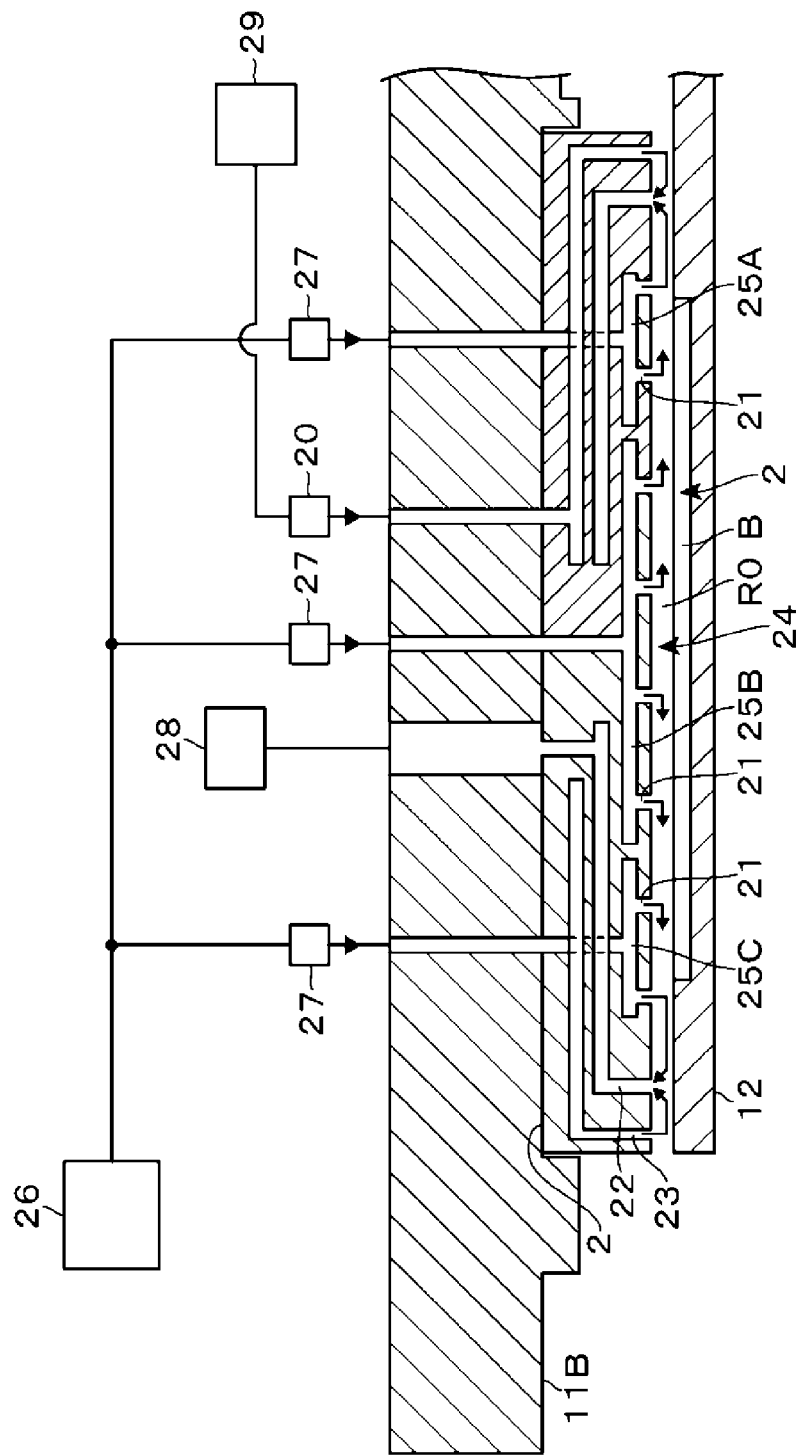
FIG. 3 is a vertical cross-sectional view of a shower head.
Figure 4:
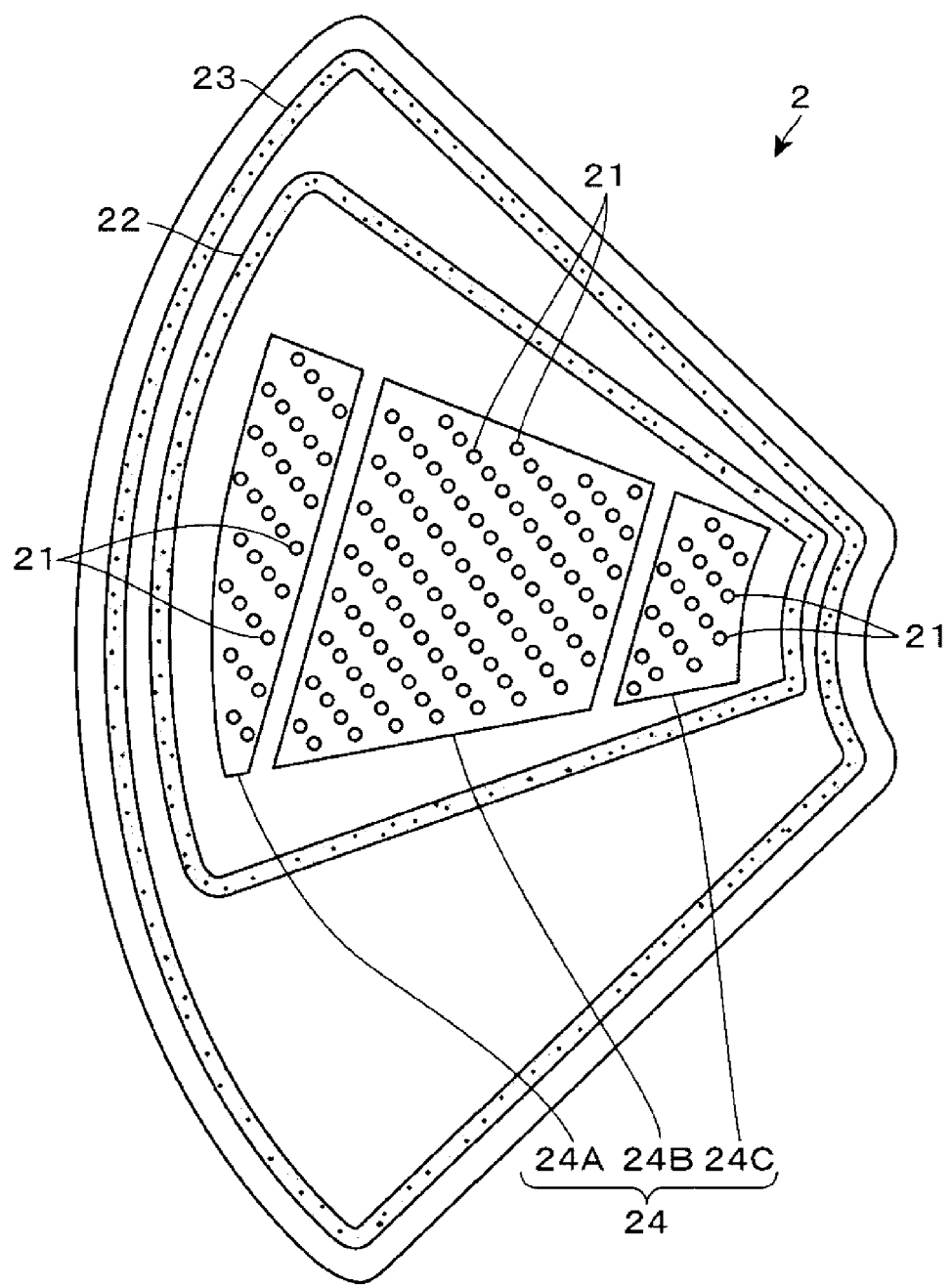
FIG. 4 is a bottom view of the shower head provided in the film forming apparatus.

The shower head 2, which is a processing-gas supply part and a raw material gas supply part, will be described with reference to FIG. 3 which is a vertical cross-sectional view and FIG. 4 which is a bottom view. The shower head 2 is formed in a fan shape that spreads in the circumferential direction of the rotary table 12 from the center side of the rotary table 12 towards the peripheral side in a plan view. A lower surface of the shower head 2 is close to and faces the top surface of the rotary table 12. In the bottom surface of the shower head 2, gas ejection ports 21, an exhaust port 22, and a purge gas ejection port 23 are opened. In FIG. 4, for the ease of distinction, the exhaust port 22 and the purge gas ejection port 23 are indicated by a large number of dots. The large number of gas ejection ports 21 are arranged in a fan-shaped region 24 inward of a peripheral edge of the bottom surface of the shower head 2. The gas ejection ports 21 eject the HCD gas downwards in the form of a shower during the rotation of the rotary table 12, and are opened such that the HCD gas is supplied to the entire surface of each wafer B.

The fan-shaped region 24 has three zones 24A, 24B, and 24C provided from the center side of the rotary table 12 towards the peripheral side of the rotary table 12. The shower head 2 is provided with gas flow paths 25A, 25B, and 25C partitioned from each other such that the HCD gas can be independently supplied to the gas ejection ports 21 provided in the respective zones 24A, 24B, and 24C. The upstream side of each of the gas flow paths 25A, 25B, 25C is connected to an HCD gas source 26 via a respective pipe. A gas supply device 27 including a valve and a mass flow controller is provided in each pipe. The gas supply device 27 performs the supply and cutoff of the HCD gas to the downstream side of the pipe and the adjustment of a flow rate of the HCD gas. Other gas supply devices (to be described later) other than the gas supply device 27 have the same configuration as that of the gas supply device 27 so as to perform the supply and cutoff of gas to the downstream side and the flow rate adjustment.

The exhaust port 22 and the purge gas ejection port 23 are annularly opened in the peripheral edge of the bottom surface of the shower head 2 so as to face the top surface of the rotary table 12 while surrounding the fan-shaped region 24. The purge gas ejection port 23 is located outside the exhaust port 22 so as to surround the exhaust port 22. A region inside the exhaust port 22 on the rotary table 12 forms an adsorption region R0 where HCD is adsorbed onto the surface of the wafer B. The purge gas ejection port 23 ejects, for example, an Ar (argon) gas as a purge gas towards the rotary table 12.

During the ejection of the HCD gas from the gas ejection ports 21, the exhaust of gas from the exhaust port 22 and the ejection of the purge gas from the purge gas ejection port 23 are simultaneously performed. As a result, as illustrated by arrows in FIG. 3, the raw material gas and the purge gas ejected towards the rotary table 12 are directed to the exhaust port 22 along the top surface of the rotary table 12 and are exhausted from the exhaust port 22. By performing the ejection of the purge gas and the gas exhaust, an atmosphere of the adsorption region R0, which is a first region, is separated from an external atmosphere so that the raw material gas can be supplied to the adsorption region R0 in a limitative manner That is, the HCD gas supplied to the adsorption region R0 is suppressed from being mixed with each gas supplied outward of the adsorption region R0 by the first to third plasma-forming units 3A to 3C as described later. Thus, it is possible to perform the film forming process using the aforementioned ALD. Reference numeral 28 in FIG. 3 denotes an exhaust mechanism for exhausting gas from the exhaust port 22 via a pipe. Reference numeral 29 in FIG. 3 denotes a source of the Ar gas, which is a purge gas, and supplies the Ar gas to the purge gas ejection port 23 via a pipe. A gas supply device 20 is provided in the pipe.

Next, the second plasma-forming unit 3B will be described with reference to FIGS. 1 and 2. The second plasma-forming unit 3B supplies microwaves to the plasma-forming gas (a $H_2$ gas or a mixed gas of the $H_2$ gas and a $NH_3$ gas) ejected downward of the second plasma-forming unit 3B so as to generate plasma on the rotary table 12. The second plasma-forming unit 3B includes an antenna 31 for supplying the microwaves. The antenna 31 includes a dielectric plate 32 and a metal-made waveguide 33.

The dielectric plate 32 is formed in a substantially fan shape that is widened from the center side of rotary table 12 towards the peripheral side in a plan view. The ceiling plate 11B of the vacuum container 11 has a substantially fan-shaped through-hole opened to correspond to the shape of the dielectric plate 32. An inner peripheral surface of a lower end of the through-hole slightly protrudes towards the center of the through-hole to form a support portion 34. The dielectric plate 32 closes the fan-shaped through-hole from the upper side and faces the rotary table 12. A peripheral edge portion of the dielectric plate 32 is supported on the support portion 34.

The waveguide 33 is provided above the dielectric plate 32, and includes an inner space 35 extending above the ceiling plate 11B. In FIG. 1, reference numeral 36 denotes a slot plate constituting a lower portion of the waveguide 33. The slot plate 36 has a plurality of slot holes 36A formed therein and is provided to be in contact with the dielectric plate 32. An end portion of the waveguide 33 on the center side of the rotary table 12 is closed. An end portion of the waveguide 33 on the peripheral side of the rotary table 12 is connected to a microwave generator 37 configured to supply microwaves of, for example, about 2.35 GHz, to the waveguide 33. These microwaves pass through the slot holes 36A of the slot plate 36, reach the dielectric plate 32, and are supplied to the plasma-forming gas supplied below the dielectric plate 32. Thus, plasma is formed below the dielectric plate 32 in a limitative manner so that processing is performed on the wafer B. As described above, a region below the dielectric plate 32 is configured as a plasma formation region which is indicated by R2.

Further, the second plasma-forming unit 3B has a gas ejection hole 41 and a gas ejection hole 42 provided in the support portion 34. The gas ejection hole 41 ejects the plasma-forming gas from the center side of the rotary table 12 towards the outer peripheral side thereof, and the gas ejection hole 42 ejects the plasma-forming gas from the outer peripheral side of the rotary table 12 towards the center side thereof. The gas ejection hole 41 and the gas ejection hole 42 are respectively connected to a $H_2$ gas source 43 and a $NH_3$ gas source 44 via a piping system including a gas supply device 45. In addition, the first and third plasma-forming units 3A and 3C are configured similarly to the second plasma-forming unit 3B. Regions corresponding to the plasma formation region R2 in the first and third plasma-forming units 3A and 3C are indicated by plasma formation regions R1 and R3, respectively. The plasma formation regions R1 to R3 are second regions. The first to third plasma-forming units 3A to 3C constitute a modifying gas supply part, a nitriding gas supply part, and a plasma-forming mechanism.

As illustrated in FIG. 1, the film forming apparatus 1 is provided with a controller 10 including a computer. The controller 10 stores a program. The program incorporates a group of steps for transmitting a control signal to each part of the film forming apparatus 1 in order to control the operation of each part and executing the above-described pre-processing and the process of forming the SiN film. Specifically, for example, the number of rotations of the rotary table 12 rotated by the rotary mechanism 13, the operation of each gas supply device, the amount of gas to be exhausted by each of the exhaust mechanisms 28 and 50, the supply and cutoff of microwaves from the microwave generator 37 to the antenna 31, and the power to be supplied to the heater 15 are controlled by the program. The control of the power to be supplied to the heater 15 corresponds to controlling the temperature of the wafer B. The control of the amount of gas to be exhausted by the exhaust mechanism 50 corresponds to controlling an internal pressure of the vacuum container 11. The program is stored in a storage medium such as a hard disc, a compact disc, a DVD, a memory card or the like, and is installed in the controller 10.

Figure 5:
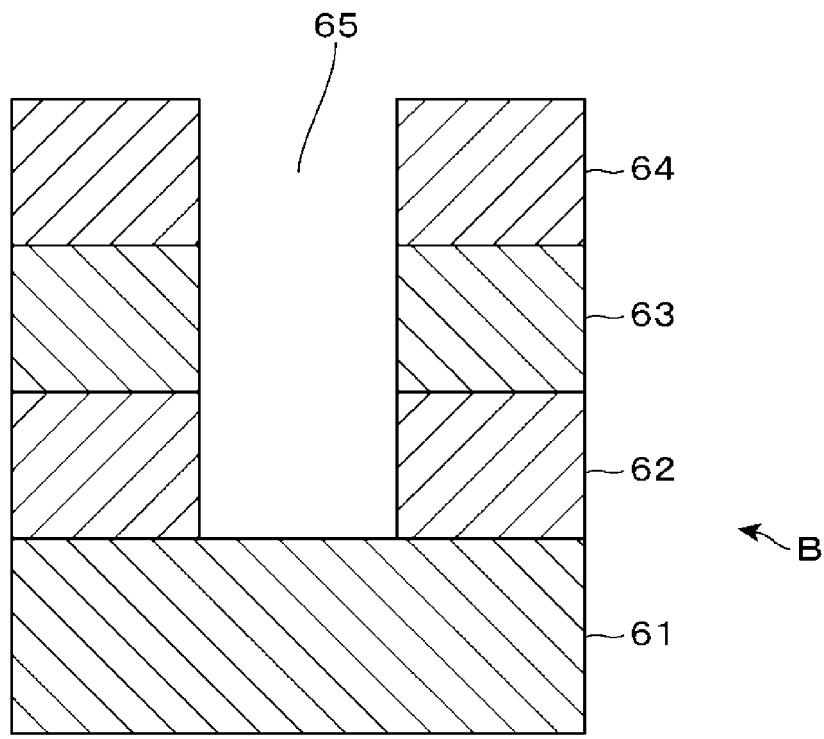
FIG. 5 is a vertical cross-sectional view of a wafer processed by the film forming apparatus.
Figure 7:
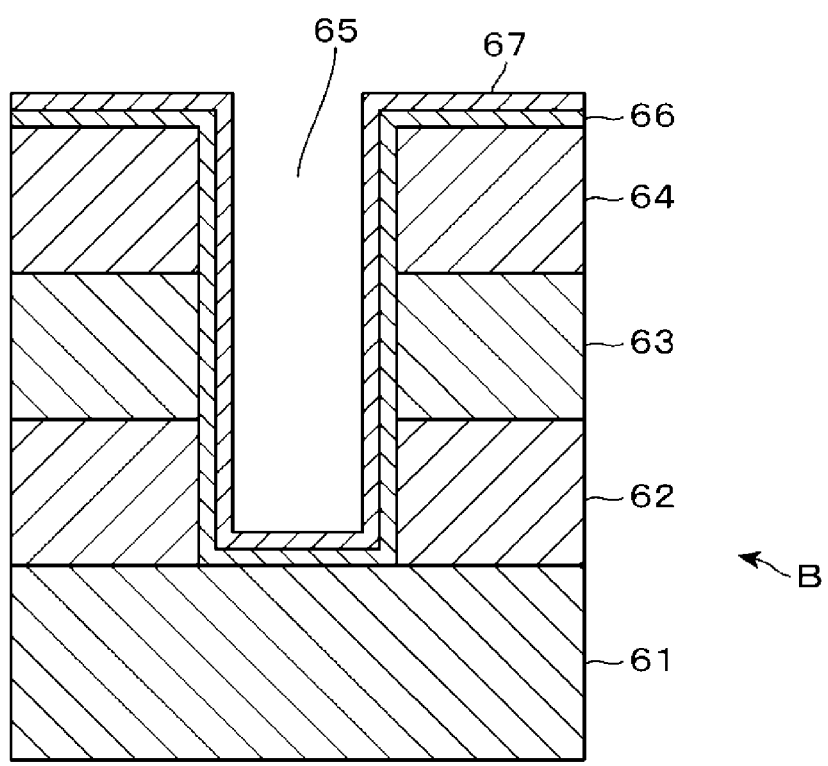
FIG. 7 is a vertical cross-sectional view of the wafer.
Figure 8:
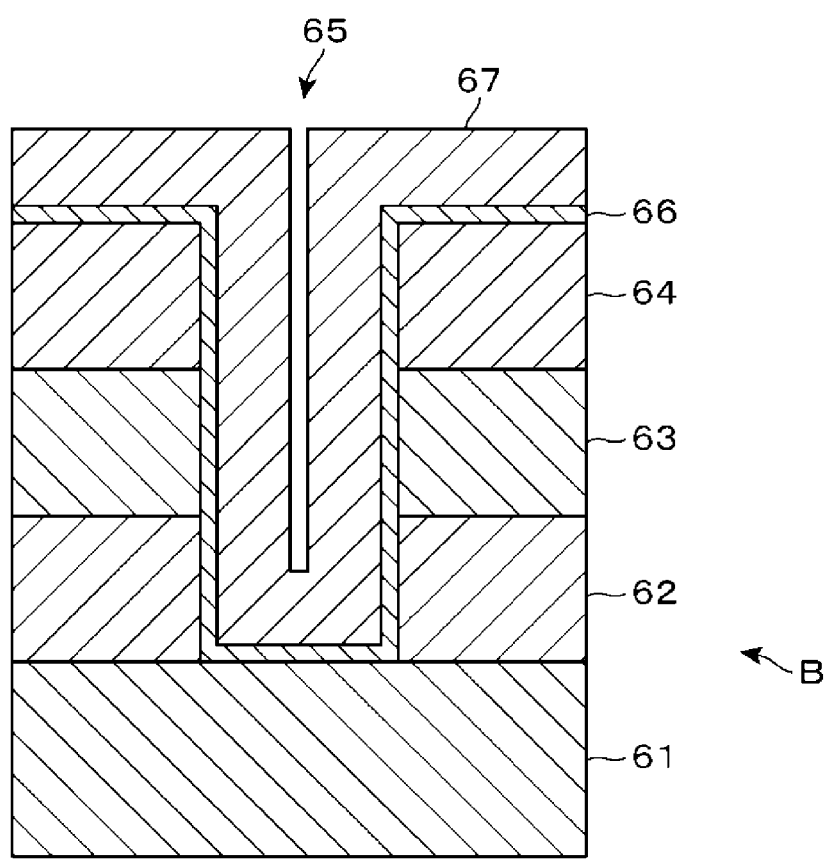
FIG. 8 is a vertical cross-sectional view of the wafer.
Figure 9:
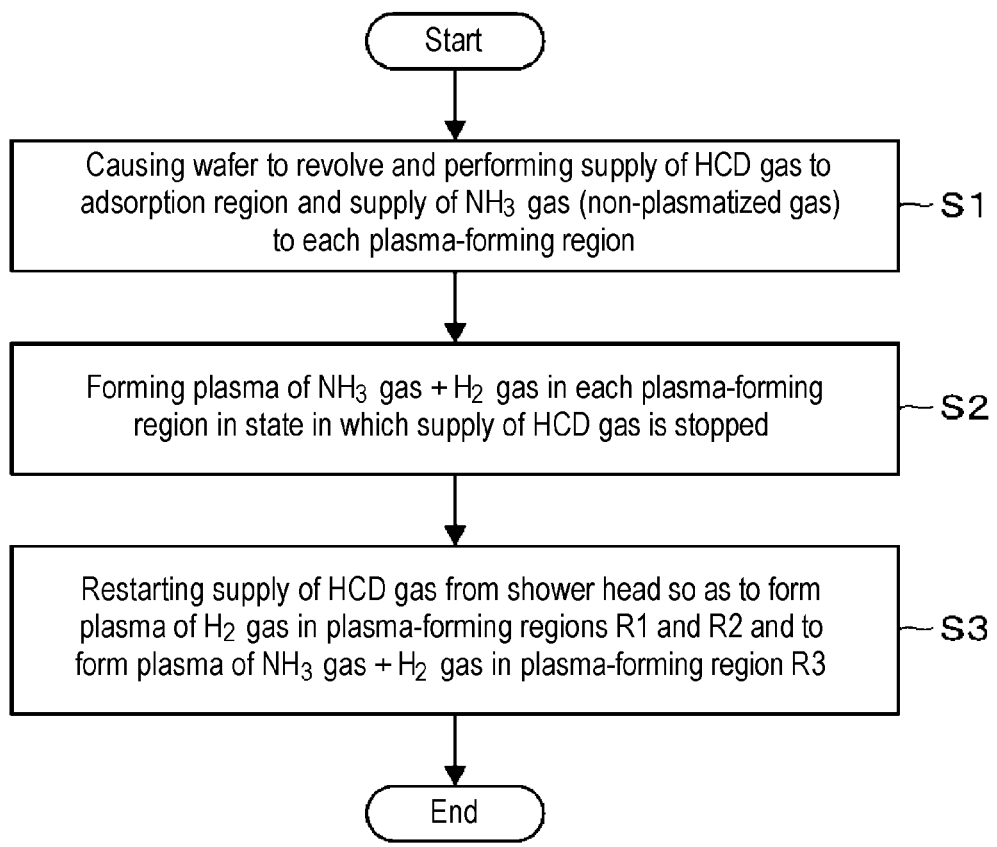
FIG. 9 is a flowchart illustrating an embodiment of a film forming method performed by the film forming apparatus.

Next, the pre-processing and the process of forming the SiN film, which are performed by the film forming apparatus 1, will be described below with reference to FIGS. 5 to 8, which are vertical cross-sectional views of the wafer B, and FIG. 9 which is a flowchart of the operation of the film forming apparatus 1. FIG. 5 illustrates an example of the wafer B transferred to the film forming apparatus 1. A laminated body in which a Si film 61, a $SiO_2$ film 62, a W film 63, and a $SiO_2$ film 64 are laminated on above another in this order upwards is formed on the wafer B. A recess 65 is formed in the laminated body. A side surface of the recess 65 is formed of the $SiO_2$ film 62, the W film 63, and the $SiO_2$ film 64, and a bottom surface of the recess 65 is formed of the Si film 61. Accordingly, as described above, the Si film, the $SiO_2$ film, and the W film are exposed on the surface of the wafer B.

Six sheets of wafers B (one illustrated in FIG. 5) are placed in the respective recesses 14 of the rotary table 12. Then, the gate valve provided at the transfer port 16 of the vacuum container 11 is closed to hermetically seal the inside of the vacuum container 11. The wafers B are heated to, for example, 200 degrees C. to 600 degrees C., more specifically, for example, 550 degrees C., by the heaters 15. Subsequently, by exhausting gas from the exhaust port 51, the inside of the vacuum container 11 becomes a vacuum atmosphere of, for example, 53.3 Pa to 666.5 Pa. The rotary table 12 is rotated at, for example, 3 rpm to 60 rpm, whereby each wafer B revolves.

The $NH_3$ gas is supplied to the plasma formation regions R1 to R3 by the first to third plasma-forming units 3A to 3C. However, microwaves are not supplied and the $NH_3$ gas is not plasmarized. Meanwhile, in the shower head 2, the HCD gas is ejected from the gas ejection ports 21 and the Ar gas is ejected from the purge gas ejection port 23, and exhaust is performed from the exhaust port 22 (step S1 in FIG. 9). By operating the shower head 2 and the first to third plasma-forming units 3A to 3C in this manner, the supply of the HCD gas and the supply of the $H_2$ gas are repeatedly performed for each revolving wafer B in an alternate manner.

Figure 6:
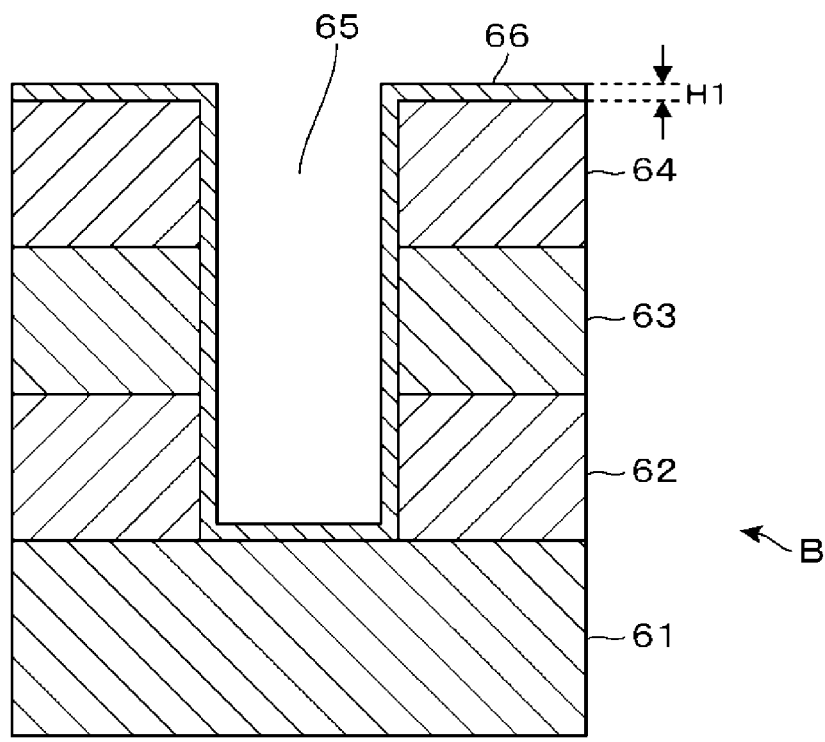
FIG. 6 is a vertical cross-sectional view of the wafer.

Si in the raw material gas is easily adsorbed to Si constituting the $SiO_2$ films 62 and 64 and the Si film 61 and W constituting the W film 63. That is, oxygen atoms are present on surfaces of the $SiO_2$ films 62 and 64 and the W film 63, and the HCD gas as the raw material gas contains two Si atoms, whereby the HCD gas high adsorptivity with respect to the $SiO_2$ films 62 and 64, the Si film 61, and the W film 63. Accordingly, the HCD gas is efficiently adsorbed onto each of these films in the adsorption region R0. Then, in the plasma formation regions R1 to R3, the $NH_3$ gas is supplied to the adsorbed HCD gas and reacts with each other by heat so as to form a thin SiN layer 66. As the revolution of each wafer B continues, the thickness of the thin SiN layer 66 increases (FIG. 6).

After the supply of the HCD gas from the shower head 2 and the supply of the $NH_3$ gas by the first to third plasma-forming units 3A to 3C are started, when the rotary table 12 is rotated a preset number of times, for example, 30 times, the supply of the HCD gas from the shower head 2 is stopped. In this manner, while the supply of the HCD gas is stopped, the $H_2$ gas and the $NH_3$ gas and microwaves are supplied to the plasma formation regions R1 to R3, and thus plasma of these gases is formed (step S2). Then, the revolution of each wafer B continues, and each wafer B repeatedly passes through the plasma formation regions R1 to R3. As a result, active species (e.g., $NH_2$ radicals and NH radicals) of the $NH_3$ gas, which constitute plasma, act on the thin SiN layer 66, so that impurities that constitute the HCD gas, such as chlorine, are released and modification for hardening the thin SiN layer 66 is performed. By this modification, the characteristics of the thin SiN layer 66 become close to those of a SiN film 67 to be formed later.

When the rotary table 12 is rotated a preset number of times from the start of plasma formation of the $H_2$ gas and the $NH_3$ gas, the supply of the HCD gas from the shower head 2 to the adsorption region R0 is resumed. Further, in the plasma formation regions R1 and R2, while the supply of the $NH_3$ gas is stopped, the $H_2$ gas is continuously supplied so that plasma of the $H_2$ gas is formed. In the plasma formation region R3, the $H_2$ gas and the $NH_3$ gas are continuously supplied so that plasma of these gases is formed (step S3).

Subsequently, each wafer B continues to revolve, and the supply of the HCD gas to the adsorption region R0, the supply of the plasmarized $H_2$ gas to the plasma formation regions R1 and R2, and the supply of the plasmarized $H_2$ gas and $NH_3$ gas to the plasma formation region R3 are sequentially repeated. Si in the HCD gas adsorbed onto the wafer B in the adsorption region R0 is nitrided in the plasma formation region R3 to become SiN. Further, in the plasma formation regions R1 and R2, the deposited SiN is modified by the plasma of $H_2$ gas. Specifically, since H is bonded to dangling bonds in SiN and Cl is removed from the deposited SiN, the SiN becomes dense and has a low content of impurities.

As described above, the formation and growth of SiN nuclei occur. Since the underlying layer is the thin SiN layer 66 made of the same material as that of the nuclei, the formation and growth of the nuclei are performed relatively quickly. Then, such a common thin SiN layer 66 is formed on each of the Si film 61, the $SiO_2$ films 62 and 64, and the W film 63, and surface conditions of these respective films are made uniform. Therefore, the nucleation and growth similarly occur on each of these films so that a thin SiN layer (the SiN film 67) is formed. That is, the SiN film 67 is formed on each of the Si film 61, the $SiO_2$ films 62 and 64, and the W film 63 so that the incubation times become uniform (FIG. 7).

As the revolution of the wafer B continues, the thickness of the SiN film 67 increases, and modification of the SiN film 67 proceeds. Since the SiN film 67 starts to be formed on each of the Si film 61, the $SiO_2$ films 62 and 64, and the W film 63 at the same timing as described above, the SiN film 67 grows with a high thickness uniformity between these films. After the supply of the HCD gas and the plasmarization of each gas in the plasma formation regions R1 to R3 in step S3 are started, when the rotary table 12 is rotated a preset number of times to form the SiN film 67 having a desired thickness, the process of forming the SiN film 67 is completed (FIG. 8). That is, the supply of each gas, the supply of microwaves, and the rotation of the rotary table 12 are stopped, and the film forming process ends. Thereafter, the wafer B is unloaded from the vacuum container 11 by the substrate transfer mechanism.

As described above, according to the process using the film forming apparatus 1, the influence of the difference in incubation time of the SiN film 67 between the Si film 61, the $SiO_2$ films 62 and 64, and the W film 63 is suppressed, which makes it possible to make the start timing of film formation uniform. As a result, it is possible to form the SiN film 67 on each film with a high thickness uniformity. Then, in forming the thin SiN layer 66 for suppressing the influence of the difference in incubation time, the nitridation of the HCD adsorbed onto the wafer B is performed by the non-plasmarized $NH_3$ gas, and subsequently, the modification is performed by the plasmarized $NH_3$ gas. That is, since plasma is not used in forming the thin SiN layer 66, the time during which the wafer B is exposed to the plasmarized $NH_3$ gas can be suppressed. When the plasma of $NH_3$ gas is formed, the thin SiN layer 66 is interposed between the plasma and each of the films 61 to 64. Therefore, the nitridation of each of the films 61 to 64 is suppressed. In particular, as shown in the evaluation test described later, the Si film 61 has a property of being relatively easily nitrided, but the nitridation of the Si film 61 can be suppressed. Further, since the time during which the wafer B is exposed to the plasmarized gas is suppressed as described above, there is also an advantage in that plasma damage to each of the films 61 to 64 can be suppressed.

In step S1 described above, the nitridation is not limited to using the $NH_3$ gas. For example, the $N_2$ gas may be used instead of the $NH_3$ gas. In addition, as the processing gas containing silicon used in step S1, a silicon halide gas, having Si—Si bonds and thus having a plurality of Si atoms in one molecule, may be used in order to secure high adsorptivity with respect to each film as described above. In addition to the HCD gas as the silicon halide gas, an octachlorotrisilane ($Si_3Cl_8$) gas may be used.

Further, the modification of the thin SiN layer 66 can be performed as described above by exposing the thin SiN layer 66 to plasma in step S2. Therefore, the present disclosure is not limited to using the plasma of $NH_3$ gas. However, it is preferable to process the thin SiN layer 66 using the plasma of $NH_3$ gas because the thin SiN layer 66 can have the same film quality as the SiN film 67 to be formed later.

In addition, the formation of the SiN film 67 after the modification of the thin SiN layer 66 is not limited to being performed using ALD, and may be performed using a chemical vapor deposition (CVD). In forming the SiN film 67, the silicon in the raw material gas can be nitrided. Therefore, the formation of the SiN film 67 is not limited to using the plasmarized $NH_3$ gas. For example, the non-plasmarized $NH_3$ gas may be used. Further, as a raw material gas for forming the SiN film 67, a gas having no Si—Si bonds, such as a DCS (dichlorosilane) gas may be used.

In the processing examples described above, the SiN film is formed on the W film 63 as a metal film. However, the metal film is not limited to the W film 63, and the present disclosure is effective even when forming the SiN film 67 on a metal film of, for example, titanium (Ti), nickel (Ni) or the like. That is, the metal film serving as the underlying film of the SiN film is not limited to the W film. It should be noted that the embodiments disclosed herein are exemplary in all respects and are not restrictive. The above-described embodiments may be omitted, replaced or modified in various forms without departing from the scope and spirit of the appended claims.

Next, the evaluation tests performed in relation to the present technology will be described.

In Evaluation Test 1, a plurality of wafers, each made of Si and having an exposed surface (bare wafers), and a plurality of wafers, each made of Si and having a $SiO_2$ film formed on the surface thereof (hereinafter, referred to as $SiO_2$ wafers) were provided. Then, a series of processes (the pre-processing and the process of forming the SiN film 67) including steps S1 to S3 described in the embodiment above were performed on each of the bare wafers and the $SiO_2$ wafers. The time required for the process of forming the SiN film 67 in step S3 in the series of processes was set to 180 seconds or 360 seconds. After completion of the series of processes, the thickness of the formed SiN film 67 was measured.

Further, in Comparative Test 1, instead of performing the process of step S1 described above, a process of nitriding each of the surfaces of the bare wafers and the $SiO_2$ wafers was performed by supplying the $N_2$ gas to the plasma formation regions R1 to R3 and plasmarizing the $N_2$ gas. After the nitridation, the process of each of the above-described step S2 and step S3 was performed on each wafer. Instead of the HCD gas, a DCS gas was used as the raw material gas in step S3. Except for these differences, the process of Comparative Test 1 was similar to the process of Evaluation Test 1.

Figure 10:
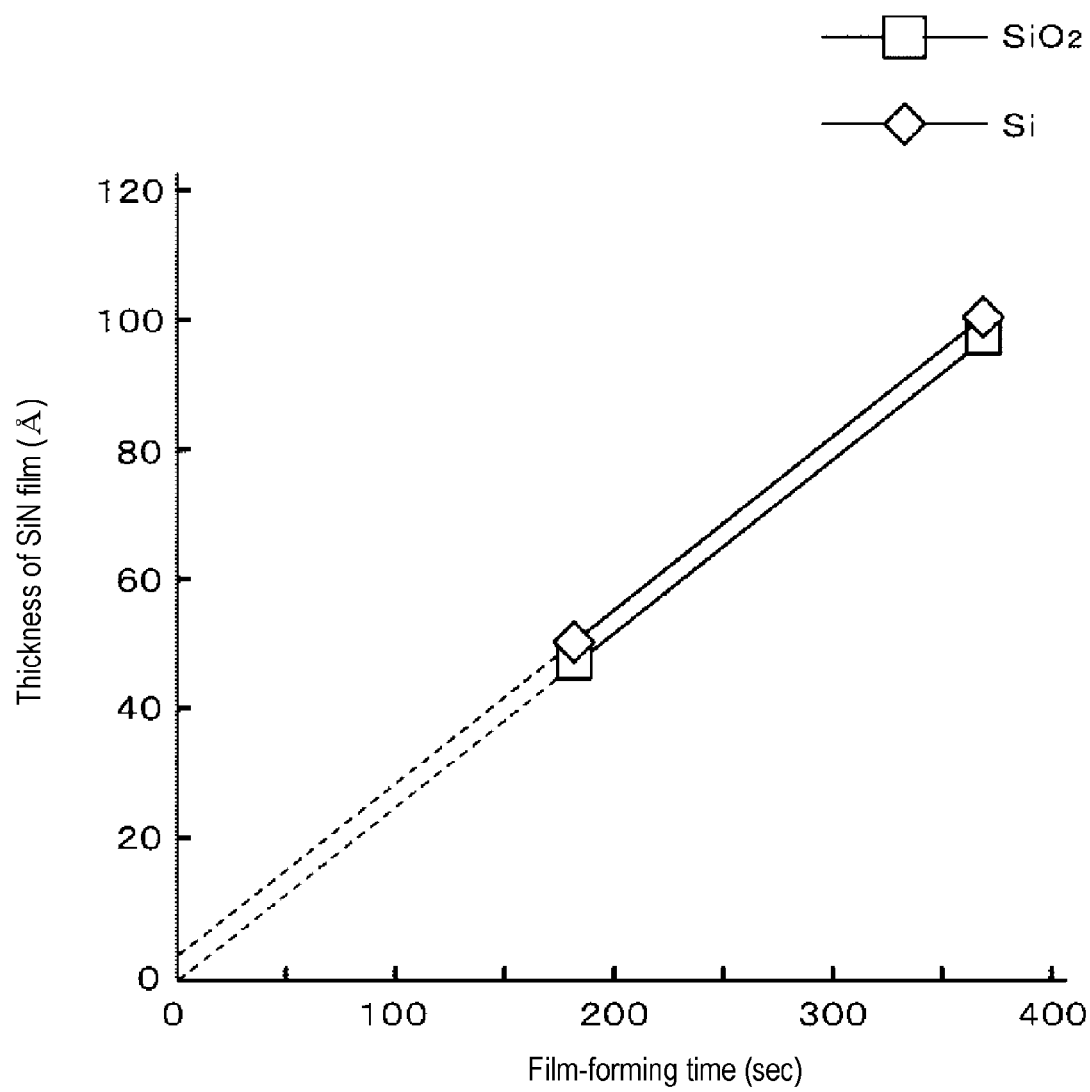
FIG. 10 is a graph representing the results of an evaluation test.
Figure 11:
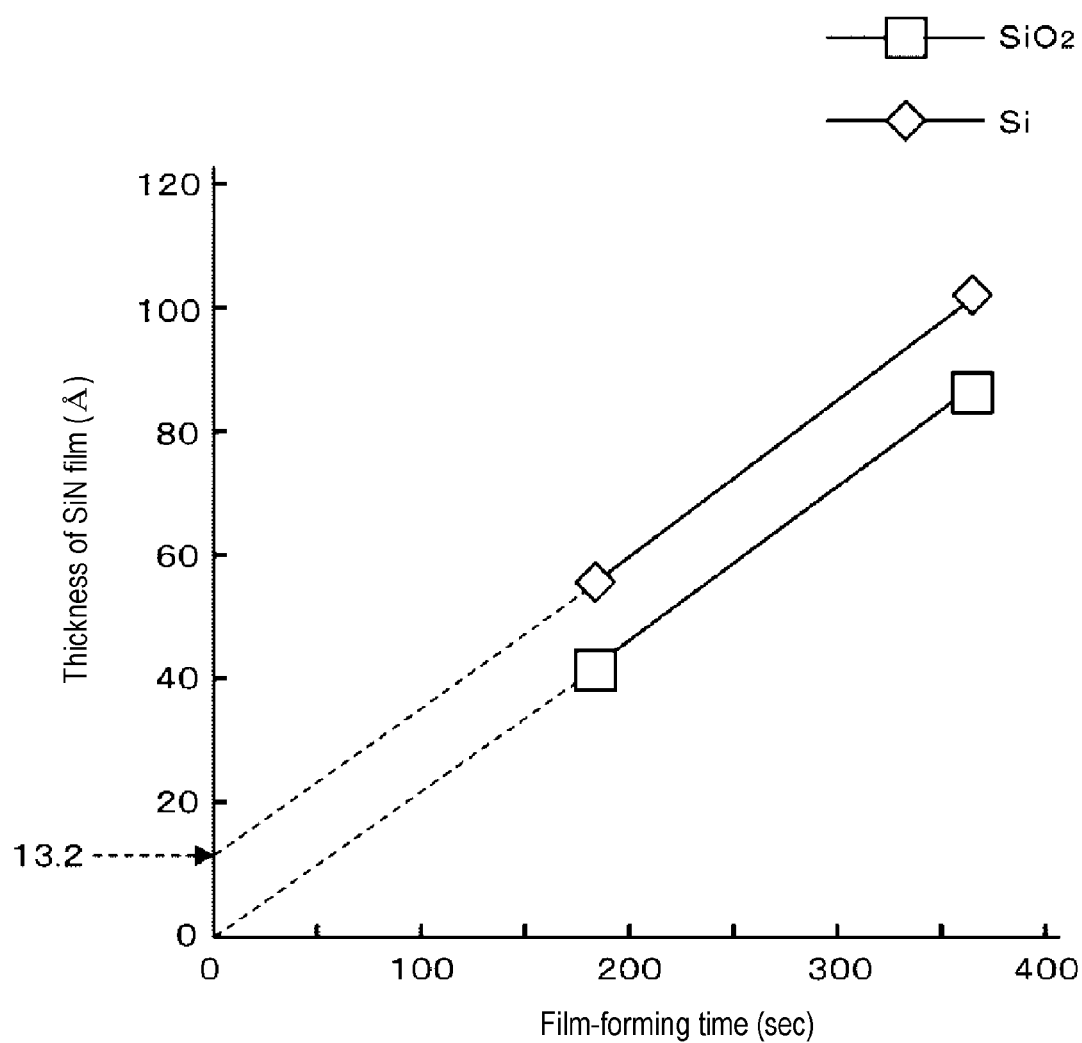
FIG. 11 is a graph representing the results of an evaluation test.

A graph of FIG. 10 shows the results of Evaluation Test 1, and a graph of FIG. 11 shows the results of Comparative Test 1. In each graph, the horizontal axis represents the film formation time of the SiN film 67 in step S3 (unit: second), and the vertical axis represents the film thickness (Å) of the SiN film 67. In each graph, the measured thicknesses of the SiN film 67 are plotted, and the solid line connecting respective points plotted for the bare wafer and the solid line connecting respective points plotted for the $SiO_2$ wafer are shown. Further, in the graphs, an extension line extending each of the above solid lines to a position where the film formation time on the horizontal axis is 0 seconds or the thickness of the SiN film 67 on the vertical axis is 0 Å is shown by the dotted lines. The incubation time for a film was defined as the time until film formation starts when a SiN film is formed to be in direct contact with the film. However, regardless of the definition, in this evaluation test, the incubation time is the film formation time when the film thickness is 0 Å, as seen from the extension of the dotted line.

In Evaluation Test 1, when the film formation time of the SiN film 67 was 180 seconds or 360 seconds, the difference in the thickness of the SiN film 67 between the $SiO_2$ wafer and the bare wafer is relatively small. The solid straight line obtained for the $SiO_2$ wafer and the solid straight line obtained for the bare wafer are substantially parallel to each other. Further, referring to the extension lines indicated by respective dotted lines, the incubation time is about 0 seconds when the thickness of the SiN film 67 on the $SiO_2$ wafer is 0 Å. At this time, the film thickness of the SiN film 67 of the bare wafer was 5.4 Å.

Meanwhile, in Evaluation Test 1, when the film formation time of the SiN film 67 was 180 seconds or 360 seconds, a relatively large difference in the thickness of the SiN film 67 was observed between the $SiO_2$ wafer and the bare wafer. The solid straight line obtained for the $SiO_2$ wafer and the solid straight line obtained for the bare wafer are substantially parallel to each other, but the distance therebetween is relatively large. Referring to the extension lines indicated by respective dotted lines, the incubation time for the $SiO_2$ wafer was about 0 seconds, but for the bare wafer, the thickness of the SiN film 67 was 13.2 Å when the film formation time was 0 seconds.

In Evaluation Test 1 and Comparative Test 1, the reason why the SiN film 67 is formed on the bare wafer when the film formation time was 0 seconds is that nitridation has already been performed in the process before performing step S3. According to Evaluation Test 1, it can be seen that the nitridation is suppressed compared with Comparative Test 1. Accordingly, from the results of Evaluation Test, the effects of the above-described embodiments were confirmed.

According to the present disclosure, in forming a silicon nitride film on a substrate having a first film and a second film exposed on a surface thereof, the present disclosure provides a technique capable of suppressing nitridation of the first film or the second film as well as making a thickness of the silicon nitride film formed on each of the first film and the second film uniform.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method of forming a silicon nitride film on a substrate having a first film and a second film formed thereon using a raw material gas containing silicon and a plasmarized nitriding gas for nitriding the silicon, wherein the first film is different from the second film, the film forming method comprising:
   supplying the raw material gas composed of a silicon halide having Si—Si bonds to the substrate;
   supplying a non-plasmarized nitriding gas to the substrate;
   forming a thin silicon nitride layer covering the first film and the second film by repeating the supplying the raw material gas and the supplying the non-plasmarized nitriding gas in sequential order;
   supplying the plasmarized nitriding gas and a plasmarized hydrogen gas to the thin silicon nitride layer so that an impurity in the raw material gas is released and the thin silicon nitride layer is hardened, while the supplying the raw material gas is stopped;
   forming the silicon nitride film on the thin silicon nitride layer by supplying the raw material gas and the plasmarized nitriding gas to the substrate; and
   supplying the plasmarized hydrogen gas and modifying the silicon nitride film formed on the thin silicon nitride layer,
   wherein the first film is a metal film, the second film is a silicon oxide film, and oxygen atoms are present on surfaces of the silicon oxide film and the metal film.

2. The film forming method of claim 1, wherein the silicon halide that constitutes the raw material gas is disilicon hexachloride.

3. The film forming method of claim 2, wherein the plasmarized nitriding gas is a plasmarized ammonia gas.

4. The film forming method of claim 3, wherein the metal film is a tungsten film.

5. The film forming method of claim 1, wherein the plasmarized nitriding gas is a plasmarized ammonia gas.

6. A film forming apparatus for forming a silicon nitride film on a substrate having a first film and a second film formed thereon using a raw material gas containing silicon and a plasmarized nitriding gas for nitriding the silicon, wherein the first film is different from the second film, the film forming apparatus comprising:
   a rotary table configured to place the substrate thereon and to cause the substrate to revolve;
   a processing gas supply part configured to supply the raw material gas composed of a silicon halide having Si—Si bonds onto the rotary table;
   a nitriding gas supply part configured to supply the plasmarized nitriding gas and a non-plasmarized nitriding gas onto the rotary table;
   a modifying gas supply part configured to supply a nitriding gas and a hydrogen gas to the rotary table;
   a plasma-forming mechanism configured to plasmarize the nitriding gas and the hydrogen gas supplied to the rotary table; and
   a controller configured to perform a processes of: repeatedly supplying the raw material gas and the non-plasmarized nitriding gas which has not been plasmarized, to the revolving substrate in an alternate manner so as to form a thin silicon nitride layer that covers the first film and the second film; supplying the plasmarized nitriding gas and a plasmarized hydrogen gas to the thin silicon nitride layer so that an impurity in the raw material gas is released and the thin silicon nitride layer is hardened, while the supplying the raw material gas is stopped; repeatedly supplying the raw material gas and the plasmarized nitriding gas to the revolving substrate in the alternating manner so as to form the silicon nitride film on the thin silicon nitride layer; and supplying the plasmarized hydrogen gas so as to modify the silicon nitride film formed on the thin silicon nitride layer,
   wherein the first film is a metal film.

7. The film forming apparatus of claim 6, further comprising:
   a first gas supply part configured to supply a gas to a first region on the rotary table; and
   a second gas supply part configured to supply a gas to a second region spaced apart from the first region on the rotary table in a rotational direction of the rotary table and having an atmosphere separated from an atmosphere of the first region,
   wherein the raw material gas supply part and the processing gas supply part correspond to the first gas supply part, and the nitriding gas supply part and the modifying gas supply part correspond to the second gas supply part, and
   wherein the plasma-forming mechanism is configured to be capable of plasmarizing the gas in the second region.

* * * * *